United States Patent
Park et al.

[11] Patent Number: 6,031,259
[45] Date of Patent: *Feb. 29, 2000

[54] SOLID STATE IMAGE PICKUP DEVICE AND MANUFACTURING METHOD THEREFOR

[75] Inventors: Yong Park, Anyang-si; Shang-Ho Moon, Seoul, both of Rep. of Korea

[73] Assignee: LG Semicon Co., Ltd., Chungcheongbuk-Do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/974,602

[22] Filed: Nov. 19, 1997

Related U.S. Application Data

[62] Division of application No. 08/568,336, Dec. 6, 1995, Pat. No. 5,723,354.

[30] Foreign Application Priority Data

Jun. 3, 1995 [KR] Rep. of Korea ........................ 95-14701

[51] Int. Cl.[7] .................... H01L 27/148; H01L 29/768; H01L 27/14
[52] U.S. Cl. .................. 257/233; 257/220; 257/222; 257/229; 257/230; 257/242
[58] Field of Search ............................. 257/229, 230, 257/431, 233, 242, 222, 220; 438/558, 563

[56] References Cited

U.S. PATENT DOCUMENTS

| | | | |
|---|---|---|---|
| 4,831,426 | 5/1989 | Kimata et al. | 357/24 |
| 4,851,890 | 7/1989 | Miyatake | 357/24 |
| 5,014,132 | 5/1991 | Kumesawa et al. | 348/311 |
| 5,200,634 | 4/1993 | Tsukada et al. | 257/291 |
| 5,288,656 | 2/1994 | Kusaka et al. | 437/53 |
| 5,349,216 | 9/1994 | Lee et al. | 257/230 |
| 5,424,775 | 6/1995 | Kamisaka et al. | 257/232 |
| 5,619,049 | 4/1997 | Kim | 257/230 |

FOREIGN PATENT DOCUMENTS 404316367  11/1992  Japan ........................ 257/229

*Primary Examiner*—Mahshid Saadat
*Assistant Examiner*—Jesse A. Fenty
*Attorney, Agent, or Firm*—Morgan, Lewis & Bockius LLP

[57] ABSTRACT

A method for manufacturing a light receiving portion for a solid state image pickup device includes the steps of forming a well of a second impurity type on a substrate of a first impurity type, forming a channel stop within an upper surface of the well, forming a vertical CCD portion within the upper surface of the well, forming a gate insulating layer on the upper surface of the well, channel stop and the vertical CCD portion, forming a charge carrying gate electrode above the vertical CCD portion, forming a light receiving photo diode by ion-implanting impurities of the first impurity type, forming a first impurity layer on the light receiving photo diode by ion-implanting impurities of the second impurity type into a surface of the light receiving photo diode, removing a portion of the gate insulating layer above the light receiving photo diode, depositing an insulating layer containing impurities of the first impurity type on the gate insulating layer, the charge carrying gate electrode and the first impurity layer, and performing a heat treatment to form a second impurity layer by doping an upper surface of the first impurity layer with the impurities of the insulating layer.

9 Claims, 5 Drawing Sheets

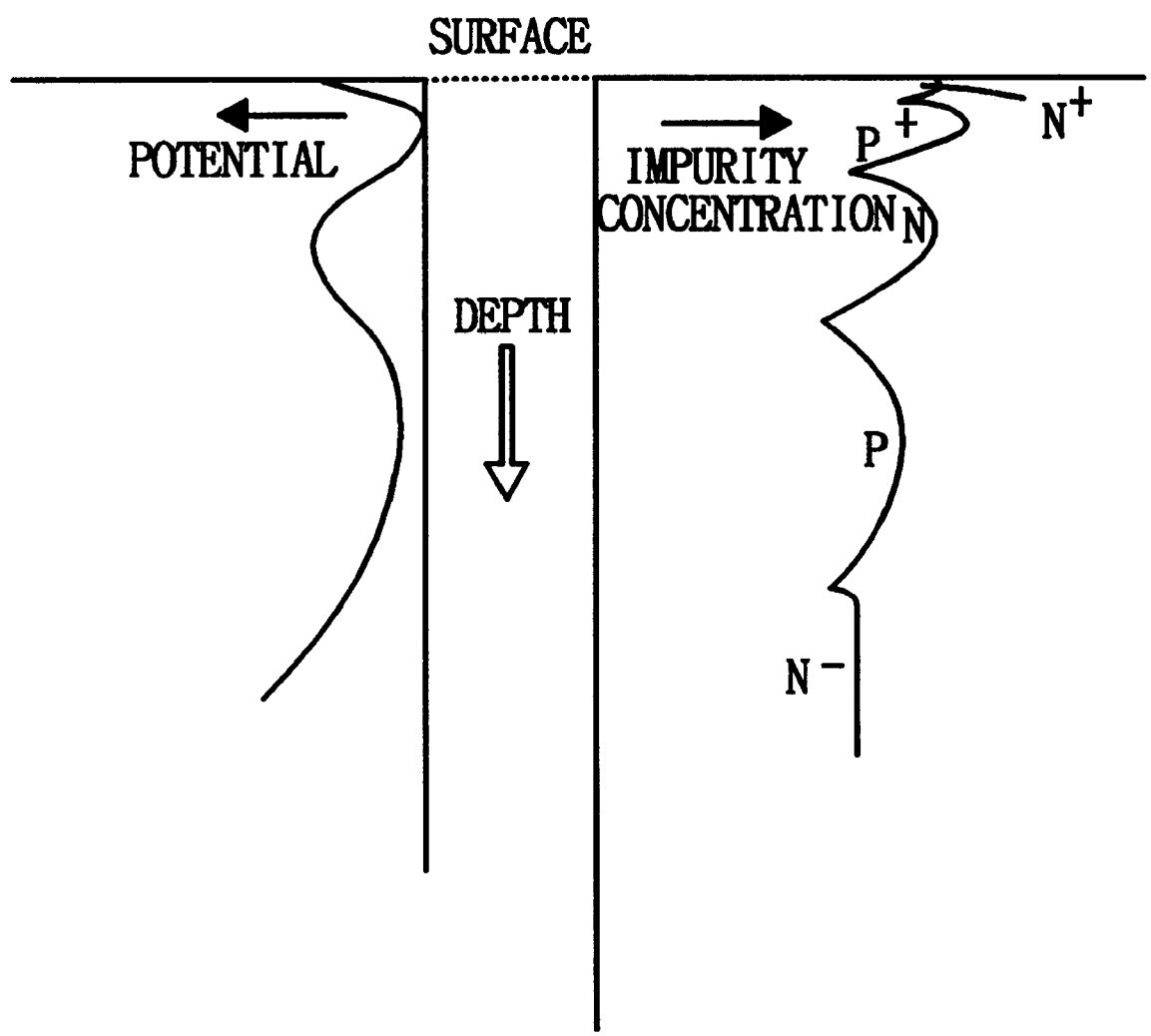

SOLID STATE IMAGE PICKUP DEVICE AND MANUFACTURING METHOD THEREFOR

This is a divisional of application Ser. No. 08/568,336 filed on Dec. 6, 1995, now U.S. Pat. No. 5,723,354.

BACKGROUND OF THE INVENTION

1. Field of the Invention

The present invention relates to a solid state image pickup device and manufacturing method therefor, and more particularly to a light receiving portion (photo diode) of a solid state image pickup device.

2. Description of the Related Art

Recently, solid state image pickup devices such as CCD devices have become widely used. FIG. 1A is a sectional view of a photo cell in a conventional solid state image pickup device. FIGS. 1B and 1C are graphical illustrations of the impurity concentration and potential distribution versus the depth from the surface, respectively. The manufacturing method for this conventional device includes the steps of forming a P type well 12 upon an N type substrate 11, forming a channel stop 13 and a vertical CCD (VCCD) 14 thereupon, forming a gate insulating layer 15, forming a charge carrying gate electrode 16, ion-implanting an N type impurity into a portion where a light receiving portion is to be formed, thereby forming a photo diode (P-D) 17. Then, P type ion impurities are implanted into the surface of the light receiving photo diode, thereby forming a $P^+$ layer 18, and an insulating oxide layer 19 is formed thereon. Finally, a light shielding metal layer 20 and a protecting layer 20a are formed.

Thus, by forming the $P^+$ layer 18 by ion-implantation of P type impurities into the surface of the N type photo diode 17, some problems are prevented. Specifically, thermal noise charges are prevented, and hydrogen ions, which are coupled with dangling bonds, are introduced into the photo diode 17. As a result, these noise charges are undesirably mixed with the desired signal charges. That is, the noise charges which are generated on the surface of the N type photo diode 17 are prevented from being introduced into the photo diode by the $P^+$ layer 18 which is formed as a barrier on the surface of the photo diode 17.

Under these conditions, the $P^+$ layer 18 can effectively serve as a barrier only if the $P^+$ layer 18 maintains a higher impurity concentration by one or more orders of magnitude as compared with the N type photo diode 17. With such concentrations, a neutral region will exist.

FIG. 1B illustrates the impurity concentrations. Here, the concentrations are sequentially reduced in the $P^+$, N, P, $N^-$ sequence. If the impurity concentration is distributed in this manner, and the surface potential is assumed to be zero as in FIG. 1C, the N region is a negative region, while the P region has a slightly negative potential as compared with the surface.

Thus the conventional light receiving portion has a $P^+$-N-P-$N^-$ structure, so that the surface charges are caught in the neutral region. If the depth of the neutral region is increased, the image pickup capability for short wavelengths is reduced, and therefore, the depth must be limited. However, if the depth is arranged to an optimum dimension, some noise charges cross the $P^+$ layer barrier causing white noise.

SUMMARY OF THE INVENTION

Accordingly, the present invention is directed to a solid state pickup device that substantially obviates one or more of the problems due to limitations and disadvantages of the related art.

An object of the present invention is to provide a light receiving portion for a solid state image pickup device and a manufacturing method thereof, in which white noise is reduced.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, the light receiving portion for a solid state image pickup device of the present invention includes a substrate of a first impurity type, a well of a second impurity type formed on the substrate, a channel stop formed within the well at an upper surface, a vertical CCD portion formed within the well at an upper surface, a light receiving photo diode of the first impurity type formed in the well at an upper surface, a first impurity layer of the second impurity type formed in an upper portion of the light receiving photo diode, a second impurity layer of the first impurity type formed in an upper portion of the first impurity layer, a gate insulating layer formed on the surface of the well and the vertical CCD, a charge carrying gate electrode formed on the gate insulating layer above the vertical CCD, an insulating layer formed on the gate insulating layer, the charge carrying electrode, and the second impurity layer, and a light shielding metal layer formed on the insulating layer.

In another aspect, the manufacturing method for a light receiving portion for a solid state image pickup device of the present invention includes the steps of forming a well of a second impurity type on a substrate of a first impurity type, forming a channel stop within an upper surface of the well, forming a vertical CCD portion within the upper surface of the well, forming a gate insulating layer on the upper surface of the well, the channel stop, and the vertical CCD portion, forming a charge carrying gate electrode above the vertical CCD portion, forming a light receiving photo diode by ion-implanting impurities of the first impurity type, forming a first impurity layer on the light receiving photo diode by ion-implanting impurities of the second impurity type into a surface of the light receiving photo diode, removing a portion of the gate insulating layer above the light receiving photo diode, depositing an insulating layer containing impurities of the first impurity type on the gate insulating layer, the charge carrying gate electrode, and the first impurity layer, and performing a heat treatment to form a second impurity layer by doping an upper surface of the first impurity layer with the impurities of the insulating layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention and are incorporated in and constitute a part of this specification, illustrate embodiments of the invention and together with the description serve to explain the principles of the invention.

In the drawings:

FIG. 4A is a graphical illustration of the impurity concentration distribution versus vertical depth of the light receiving portion in the solid state image pickup device according to the present invention; and FIG. 4B is a graphical illustration of the potential distribution versus vertical depth of the light receiving portion in the solid state image pickup device according to the present invention.

DESCRIPTION OF THE PREFERRED EMBODIMENT

Reference will now be made in detail to the present preferred embodiments of the invention, examples of which are illustrated in the accompanying drawings.

Figure 1A:
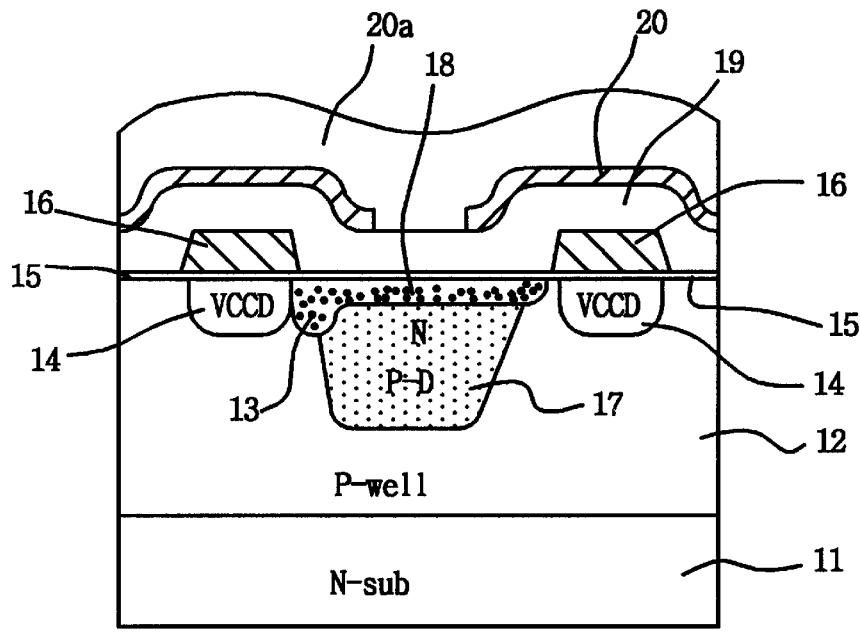
FIG. 1A is a sectional view of a light receiving portion in a conventional solid state image pickup device.
Figures 1B, 1C:
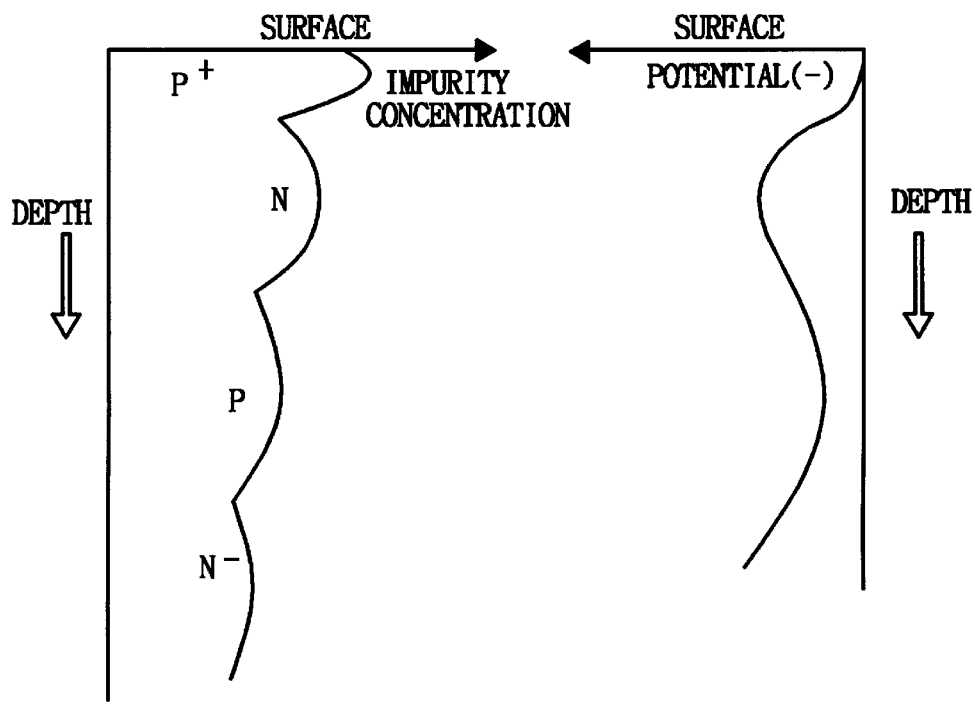
FIG. 1B is a graphical illustration of the impurity concentration versus vertical depth of the light receiving portion in the conventional image pickup device.
FIG. 1C is a graphical illustration of the potential distribution versus the vertical depth of the light receiving portion in the conventional image pickup device.
Figure 2A:
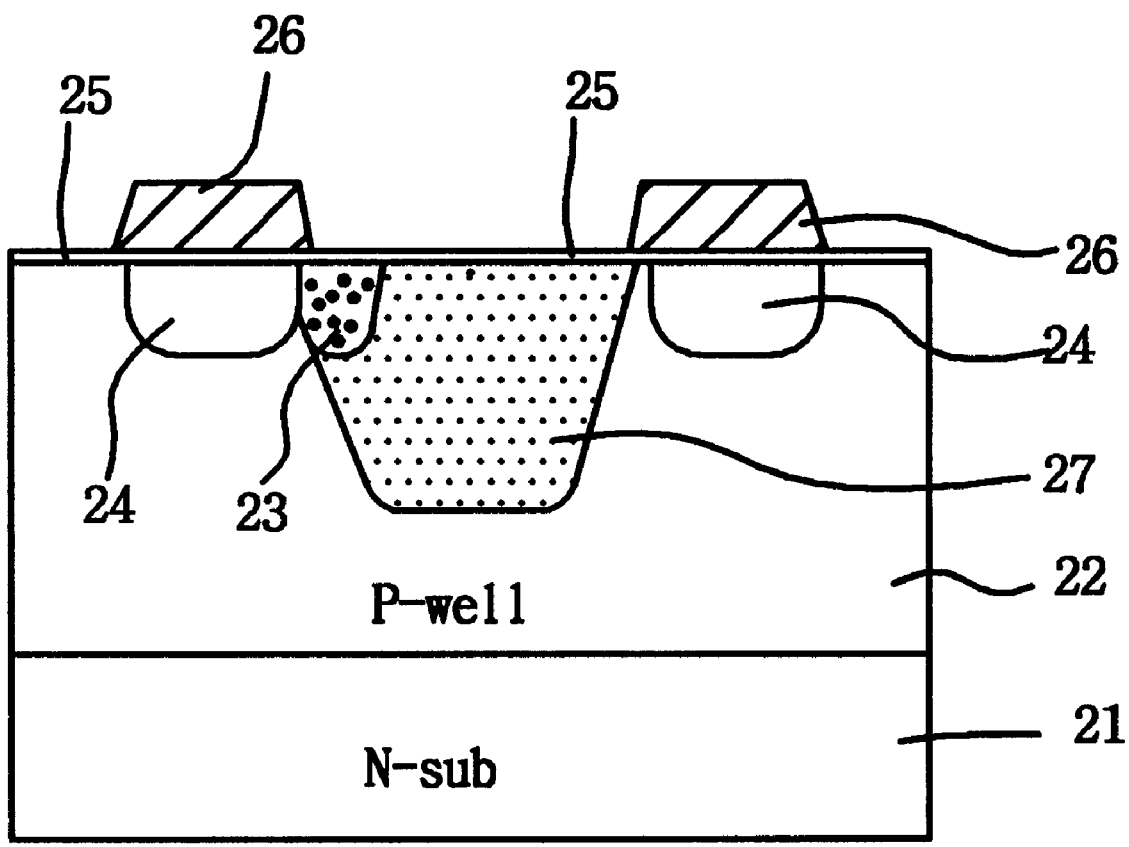
FIGS. 2A to 2C are sectional views of a light receiving portion in a solid state image pickup device according to the present invention.
Figure 2B:
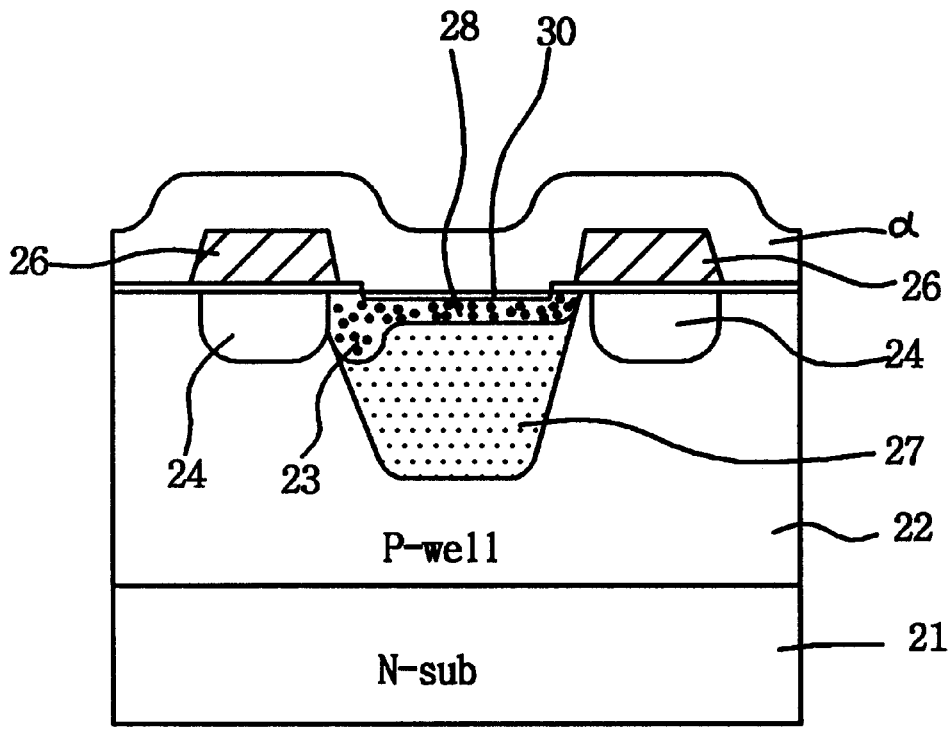
Figure 3A:
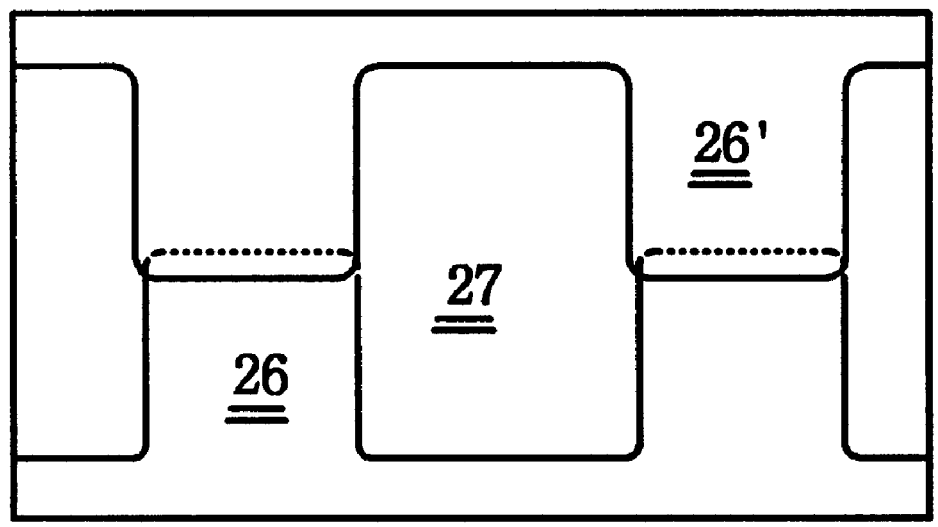
FIGS. 3A and 3B are schematic layouts of the light receiving portion in the solid state image pickup device according to the present invention.
Figure 3B:
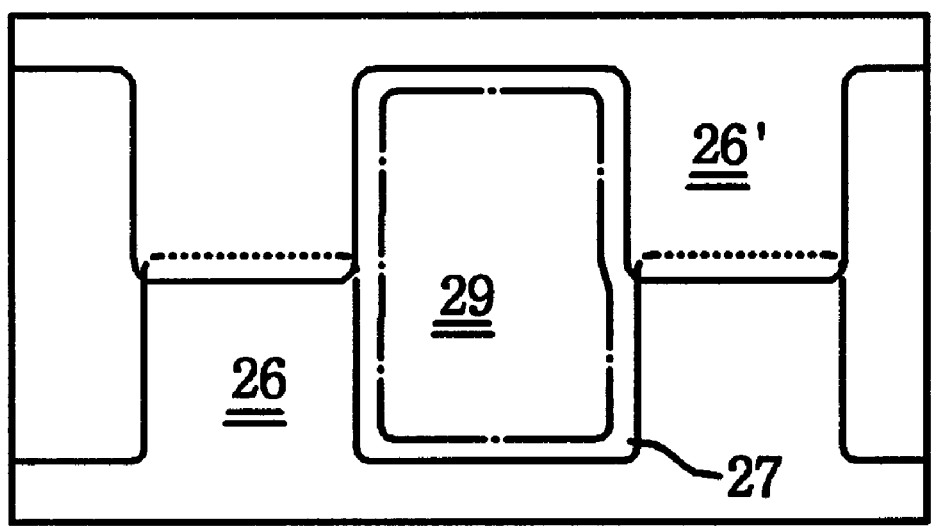

FIGS. 2A and 2B are partial sectional views showing the structure and a method for manufacturing a light receiving portion for a solid state image pickup device in accordance with the present invention, and FIGS. 3A and 3B illustrate its layouts. As shown, a $P^+$ layer 28 is formed at the surface of a light receiving portion, and then, a gate insulating layer 25 is formed as with the conventional technique. That is, a P type well 22 is formed on an N type substrate 21, and then, a channel stop 23 and a vertical CCD (VCCD) 24 are formed. Then, a gate insulating layer 25 and a charge carrying gate electrodes 26 are formed. N type impurities are ion-implanted into a portion where a light receiving portion is to be formed, thereby forming a photo diode (P-D) 27. Up to this point, the process is similar to that of the conventional technique.

Figure 2C:
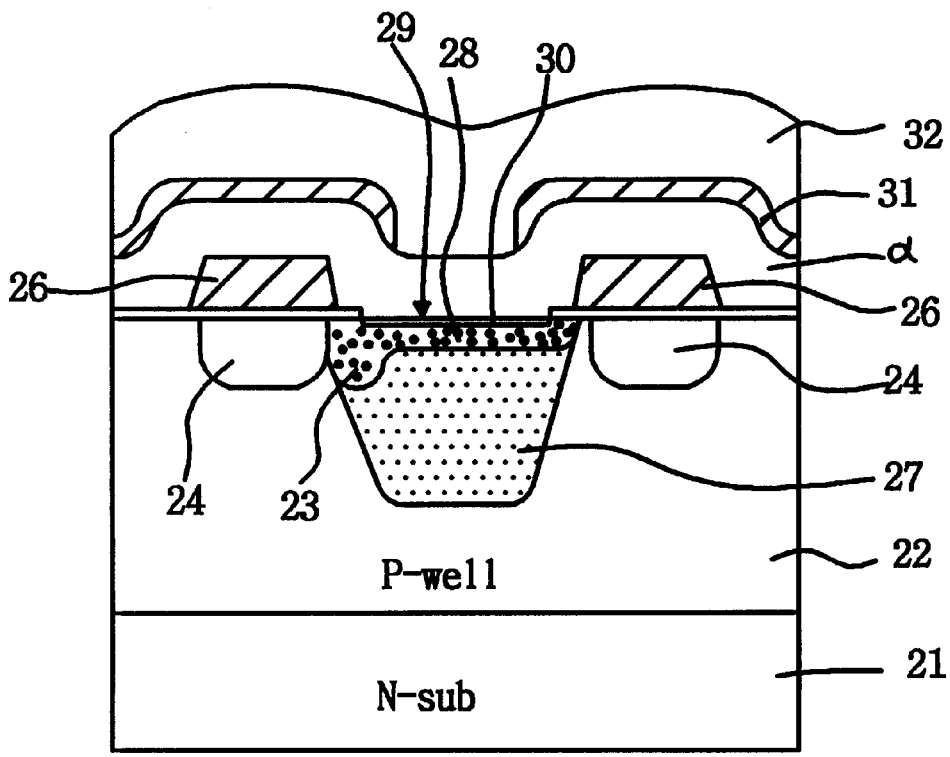

As shown in FIGS. 2B and 3B, a P type impurity is ion-implanted into the surface of the light receiving portion to form a $P^+$ layer 28. Then, a photo etching process is applied to remove the gate insulating layer 25 from the light receiving portion 27, thereby opening a light receiving window 29. In this step, a wet etch is applied. Then, a layer α composed of a material containing an N type impurity is deposited. When the deposited layer α covers the gate electrode 26, a step is formed, and therefore, a heat treatment is applied to flatten the step. In this process, the N type impurity is doped into the surface of the light receiving portion, so that a shallow n-p junction is formed on the surface. Thus, an N type ($N^+$ or N) region 30 is formed, so that the structure of the light receiving portion becomes N (or $N^+$)-$P^+$-N-P-$N^-$. A light shielding metal layer 31 and protecting layer 32 are formed as shown in FIG. 2C.

Alternatively, instead of the automatic doping by depositing the layer α, an N doped polysilicon layer may be formed and heat treated to automatically dope the surface. The polysilicon layer is then removed. As another method, instead of automatically doping through the layer α, N type impurities may be ion-implanted into only the surface, thereby forming an N type surface layer. Of course, after forming the N type layer on the surface, an insulating oxide layer 33 (without impurities), the light shielding metal layer 31 and the protecting layer 32 are formed.

Thus, by making the N or $N^+$ impurity automatically doped into the surface, the structure of the light receiving portion becomes N (or $N^+$)-$P^+$-N-P-$N^+$ from the surface into the deep portion. Of course, if P and N type impurities are exchanged, the same results are obtained.

In the conventional structure, the surface of the light receiving portion is protected by only the $P^+$ layer in the conventional technique, but according to the present invention, an N or $N^+$ layer is additionally formed on the surface of the $P^+$ layer. Therefore, a large scale barrier consisting of an n-p junction is formed, and therefore, surface noise charges are prevented from being introduced into the light receiving portion in a perfect manner.

According to the present invention as described above, the white noise is effectively inhibited, thereby improving the yield of the CCD image pickup device.

It will be apparent to those skilled in the art that various modifications and variations can be made in the solid state pickup device of the present invention without departing from the spirit or scope of the invention. Thus, it is intended that the present invention cover the modifications and variations of this invention provided they come within the scope of the appended claims and their equivalents.

What is claimed is:

1. A light receiving portion for a solid state image pickup device having a gate insulating layer, comprising a vertical structure of adjacent layers having the structure of $N^+$-$P^+$-N-P-$N^-$, wherein the light receiving portion has a light receiving window which has a width substantially the same as the $N^+$ region, and the light receiving window is an opening in the gate insulating layer.

2. The light receiving portion for a solid state image pickup device of claim 1, wherein the impurity concentration of the $N^+$ region is higher than the impurity concentration of the $P^+$ region.

3. The light receiving portion for a solid state image pickup device of claim 1, wherein the impurity concentration of the $N^+$ region is lower than the impurity concentration of the $P^+$ region.

4. The light receiving portion for a solid state image pickup device of claim 1, wherein the $N^{30}$ region is formed within the $P^+$ region.

5. A light receiving portion for a solid state image pickup device, comprising:

a substrate of a first impurity type;

a well of a second impurity type on the substrate;

a channel stop within the well at an upper surface;

a vertical CCD portion within the well at an upper surface;

a light receiving photo diode of the first impurity type in the well at an upper surface;

a first impurity layer of the second impurity type in an upper portion of the light receiving photo diode;

a second impurity layer of the first impurity type in an upper portion of the first impurity layer;

a gate insulating layer on the surface of the well and the vertical CCD, the gate insulating layer having an opening for receiving light;

a charge carrying gate electrode on the gate insulating above the vertical CCD;

an insulating layer on the gate insulating layer, the charge carrying electrode, and the second impurity layer; and a light shielding metal layer formed on the insulating layer.

6. A solid state image pickup device having a gate insulating layer, comprising:

a light receiving portion having a vertical structure of adjacent layers which have a structure of $N^+$-$P^+$-N-P-

N⁻, the light receiving portion being under an opening in the gate insulating layer for receiving light; and an insulating layer on the N⁺ region the light receiving portion.

7. The solid state image pickup device according to claim 6, wherein the N⁺ layer has an impurity concentration higher than the P⁺ layer.

8. The solid state image pickup device according to claim 6, wherein the N⁺ layer has an impurity concentration lower than the P⁺ layer.

9. The solid state image pickup device according to claim 6, wherein the N⁺ layer is formed within the P⁺ layer.

* * * * *